(12) United States Patent
Kung et al.

(10) Patent No.: US 8,269,329 B2
(45) Date of Patent: Sep. 18, 2012

(54) MULTI-CHIP PACKAGE

(75) Inventors: Moriss Kung, Taipei Hsien (TW); Kwun-Yao Ho, Taipei Hsien (TW)

(73) Assignee: VIA Technologies, Inc., New Taipei (TW)

( * ) Notice: Subject to any disclaimer, the term of this patent is extended or adjusted under 35 U.S.C. 154(b) by 1075 days.

(21) Appl. No.: 11/549,641

(22) Filed: Oct. 14, 2006

(65) Prior Publication Data

US 2009/0200651 A1    Aug. 13, 2009

Related U.S. Application Data

(63) Continuation-in-part of application No. 10/709,925, filed on Jun. 7, 2004, now abandoned.

(30) Foreign Application Priority Data

Jul. 24, 2003  (TW) ................................ 92120188 A

(51) Int. Cl.
*H01L 23/02* (2006.01)
(52) U.S. Cl. ........ 257/685; 257/777; 257/686; 257/723; 257/678; 257/787; 257/778; 257/E25.013

(58) Field of Classification Search ............... 257/685, 257/777, E25.013, 686, 723, 678, 787, 778
See application file for complete search history.

(56) References Cited

U.S. PATENT DOCUMENTS

| | | | | |
|---|---|---|---|---|
| 5,808,878 A | * | 9/1998 | Saito et al. | 361/818 |
| 6,137,164 A | * | 10/2000 | Yew et al. | 257/686 |
| 6,525,413 B1 | * | 2/2003 | Cloud et al. | 257/686 |
| 2002/0042164 A1 | * | 4/2002 | Funaya et al. | 438/125 |
| 2002/0070458 A1 | * | 6/2002 | Tago | 257/777 |
| 2004/0145051 A1 | * | 7/2004 | Klein et al. | 257/734 |

* cited by examiner

*Primary Examiner* — Junghwa M Im
(74) *Attorney, Agent, or Firm* — Jianq Chyun IP Office

(57) ABSTRACT

A multi-chip package structure is provided with a first chip, a substrate adjacent to the first chip, a plurality of contacts connecting the first chip and the substrate, a second chip disposed between the first chip and the substrate and connecting to the first chip, and a underfill film, wherein the underfill film covers the contact to isolate the contact from the second chip, wherein an empty space is defined by the second chip and the substrate so that the second chip does not contact the substrate.

18 Claims, 7 Drawing Sheets

MULTI-CHIP PACKAGE

CROSS-REFERENCE TO RELATED APPLICATION

This application is a continuation-in-part of a prior application Ser. No. 10/709,925, filed Jun. 7, 2004, which claims the priority benefit of Taiwan application serial no. 92120188, filed on Jul. 24, 2003. All disclosures are incorporated herewith by reference.

BACKGROUND OF THE INVENTION

1. Field of the Invention

The present invention relates to a multi-chip package structure. More particularly, the present invention relates to a multi-chip package structure having a plurality of flip chips stacked over a substrate carrier, capable of improving electrical performance of the substrate and reducing area occupation of the multi-chip package.

2. Description of the Related Art

In this information-base society, electronic products have become an indispensable tool serving us in many ways all around the clock. As electronic technologies continue to progress, many multi-functional and fast computing electronic products with a large memory storage capacity have been developed. These products are not only more powerful than the previous generation, but also increasingly light and compact as well. To reduce weight and volume of a package, the concept of integration must be incorporated into the design of integrated circuits. Since the fabrication of integrated circuits with nanometric features is now possible, many functions can be incorporated within a tiny chip.

To increase chip package function without increasing size, semiconductor manufacturers have developed several highly compact type of packages including the multi-chip module, the chip-scale package and the stacked multi-chip package. FIG. 1 is a schematic cross-sectional view of a conventional stacked multi-chip package structure.

As shown in FIG. 1, a conventional stacked multi-chip package 100 comprises a first chip 110, a second chip 120, a substrate 130, a plurality of bumps 140, 142, some insulating material 150 and a plurality of solder balls 160. The first chip 110 has a plurality of bonding pads 112, 116 on an active surface 114. The second chip 120 similarly has a plurality of bonding pads 122 on an active surface 124. The first chip 110 and the second chip 120 are electrically connected through the bumps 140. One end of each bump 140 is bonded to one of the bonding pads 112 of the first chip 110. The other end of the bump 140 is bonded to a corresponding bonding pad 124 on the second chip 120. The active surface 114 of the first chip 110 faces the active surface 124 of the second chip 120. The substrate 130 has a through opening 132 capable of accommodating the entire second chip 120. Furthermore, the substrate 230 has a plurality of bonding pads 134, 135 on an upper surface 136 and a lower surface 137. The bonding pads 134 are positioned around the peripheral region of the opening 132. The first chip 110 and the substrate 130 are joined together through the bumps 142. One end of each bump 142 is bonded to one of the bonding pads 116 of the first chip 110. The other end of the bump 142 is bonded to a corresponding bonding pad 134 of the substrate 130. The solder balls 160 are attached to the respective bonding pads 135 of the substrate 130. The insulating material 150 is deposited within the opening 132 to enclose the bumps 140 and the second chip 120.

In the aforementioned multi-chip package 100, the opening 132 must be fabricated in the substrate 130 to accommodate the second chip 120. Moreover, circuit wires have to be routed around the opening 132, causing the increase of the overall signal transmission length. This setup not only lowers the electrical performance of the substrate 130, but also complicates the manufacturing process and increases the production cost. Meanwhile, the outer perimeter of the substrate 130 has to increase, thus leading to some difficulties in reducing overall size of the multi-chip package 100.

SUMMARY OF THE INVENTION

Accordingly, at least one object of the present invention is to provide a multi-chip package structure capable of improving the electrical performance of the substrate inside the package.

At least a second object of this invention is to provide a multi-chip package structure capable of lowering the production cost of the substrate inside the package.

At least a third object of this invention is to provide a multi-chip package structure capable of reducing surface area of the multi-chip package.

At least a fourth object of this invention is to provide a multi-chip package structure capable of improving the heat dissipation of the multi-chip package.

To achieve these and other advantages and in accordance with the purpose of the invention, as embodied and broadly described herein, the invention provides a multi-chip package structure. The multi-chip package structure at least comprises a substrate, a first chip, a second chip, a plurality of first bumps and a plurality of contacts. The first chip positioned over the substrate has an active surface. The second chip is connected to the active surface of the first chip and positioned between the substrate and the first chip. The height of the second chip in a direction perpendicular to the active surface of the first chip or the thickness of the second chip is h1. A first empty space is defined by the second chip and the substrate so that the second chip does not contact the substrate. The first bumps are positioned between the active surface of the first chip and the second chip. The height of each bump in a direction perpendicular to the active surface of the first chip is h2. The contacts protrude from the active surface of the first chip and the height of each contact in a direction perpendicular to the active surface of the first chip is h3. Finally, the relation between the values of h1, h2 and h3 can be represented by an inequality: $h3 > h1 + h2$.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
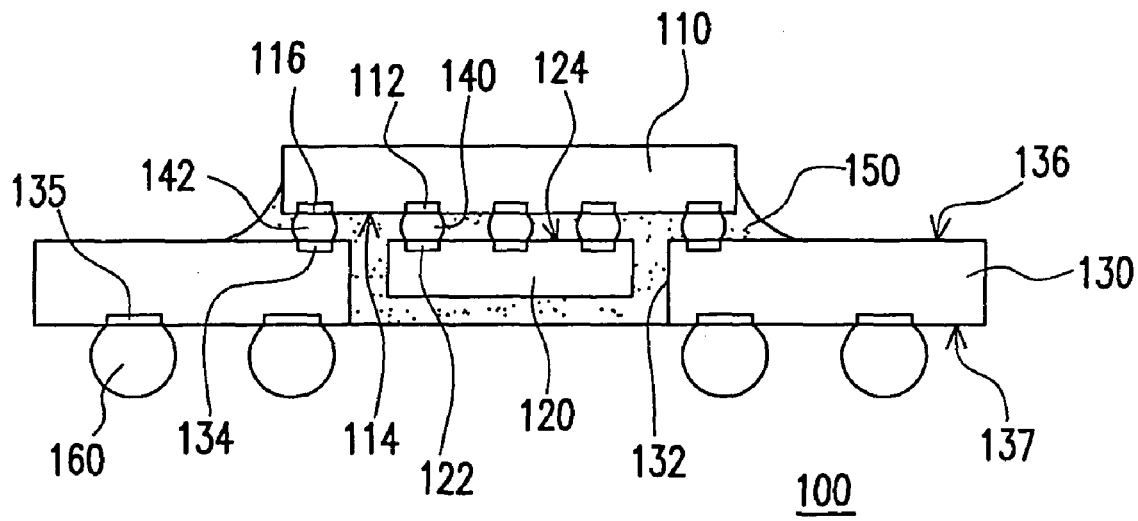
FIG. 1 is a schematic cross-sectional view of a conventional stacked multi-chip package structure.

References will now be made in detail to the present preferred embodiments of the invention, examples of which are illustrated in the accompanying drawings. Wherever possible, the same reference numbers are used in the drawings and the description to refer to the same or like parts.

Figure 2:
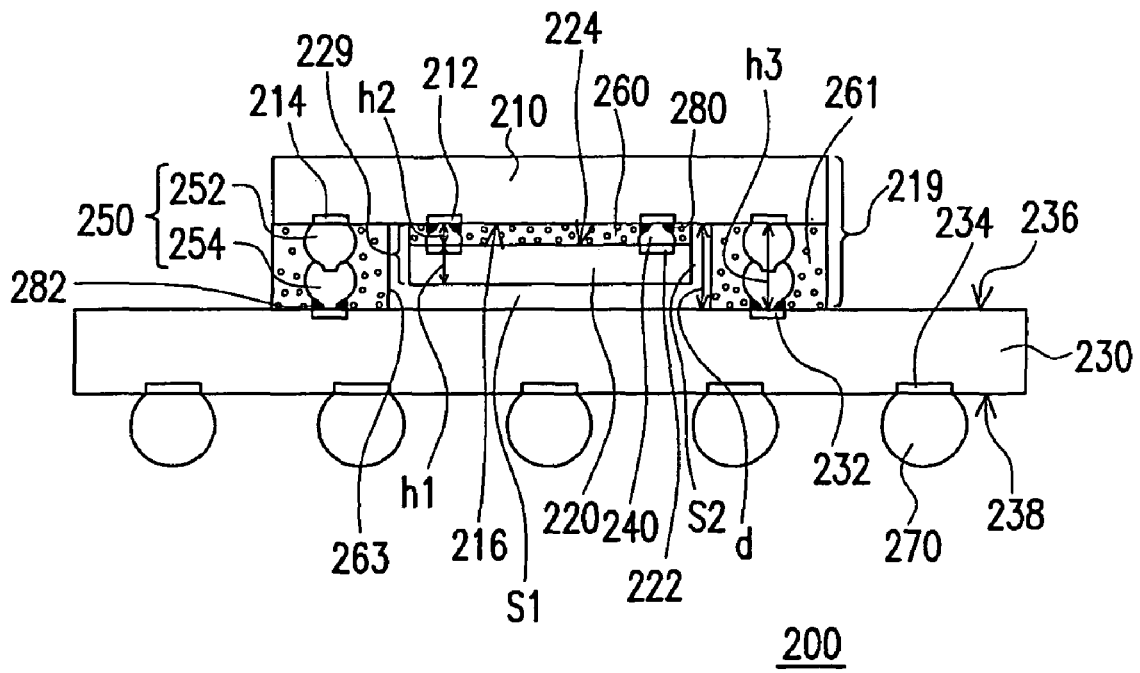
FIG. 2 is a schematic cross-sectional view of a multi-chip package structure according to a first preferred embodiment of this invention.
Figure 3:
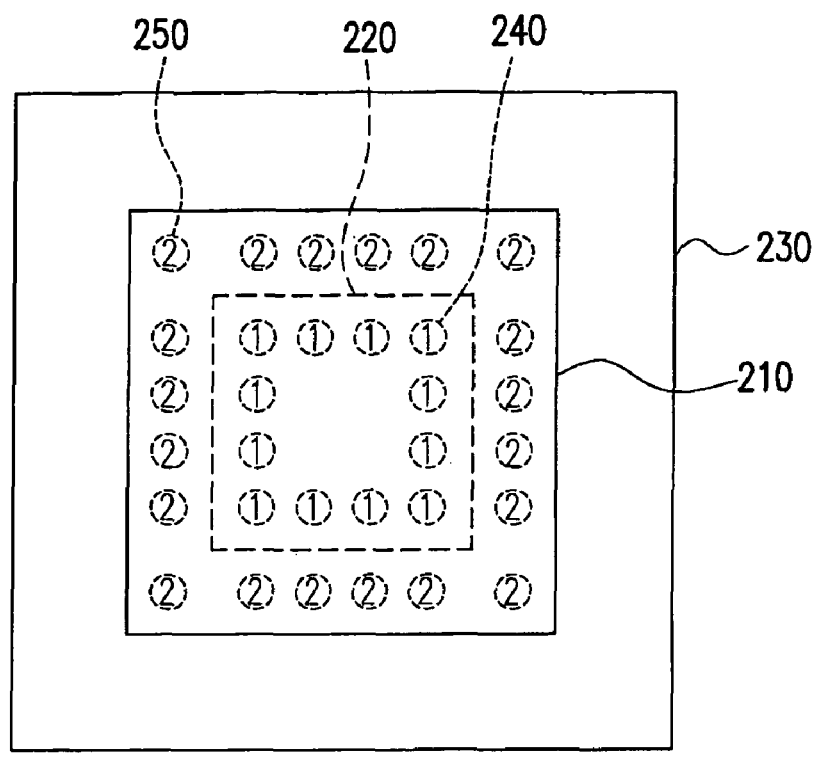
FIG. 3 is a top view showing the multi-chip package according to the first preferred embodiment of this invention.

FIG. 2 is a schematic cross-sectional view of a multi-chip package structure according to a first preferred embodiment of this invention. FIG. 3 is a top view showing the multi-chip package according to the first preferred embodiment of this invention. The multi-chip package structure 200 comprises a first chip 210, a second chip 220, a substrate 230, a plurality of bumps 240, a plurality of contacts 250, some insulating material 260 and a plurality of solder balls 270. The first chip 210 has a plurality of bonding pads 212, 214 on an active surface 216. The second chip 220 also has a plurality of bonding pads 222 on an active surface 224. The first chip 210 and the second chip 220 are electrically connected via the bumps 240 (labeled 1 in FIG. 3).

To fabricate the bumps 240, a wire-bonding machine (not shown) is deployed to form stud bumps on the bonding pads 222 of the second chip 220. Thereafter, an underfill film 260 made from an insulating material is formed over the active surface 224 of the second chip 220. The underfill film 260 exposes the top surface of the bumps 240 to produce a package module 229 that can be electrically tested independently. The package module 229 has a chip-scale package (CSP) configuration, for example. In this embodiment, the package module 229 comprises the second chip 220, the bumps 240 and the underfill film 260. After performing an electrical test on the package module 229 to confirm its electrical performance, the package module 229 is mounted on the first chip 210. A screen printing method can be one of the ways to deposit solder material 280 on the bonding pads 212 of the first chip 210. The package module 229 is connected to the first chip 210 such that the bumps 240 are in contact with the solder material 280 over the bonding pads 212. A reflow process is carried out to join the bumps 240 to the respective bonding pads 212 on the first chip 210 via the solder material 280. Hence, the second chip 220 is electrically connected to the first chip 210 through the bumps 240 and the solder material 280.

However, the method of joining the bumps 240 with the bonding pads 212 is not limited to the aforementioned process. For example, a thermal-sonic bonding may be used to bond the bumps 240 directly to the respective bonding pads 212 on the first chip 210 after checking the electrical performance of the package module 229. Thereafter, the underfill film 260 is thermally cured to fill the space between the first chip 210 and the second chip 220.

The substrate 230 has a plurality of bonding pads 232, 234 on an upper surface 236 and a lower surface 238 respectively. The first chip 210 is electrically connected to the substrate 230 via contacts (labeled 2 in FIG. 3). Each contact 250 can comprise a pair of stacked bumps 252 and 254. In another embodiment, more bumps may be stacked to increase the overall height level of the contacts 250. For example, three, four or some other number of bumps may be stacked on top of each other to produce higher contacts 250.

In this embodiment, the stacked bumps 252, 254 are manufactured by using a wire bonding machine. First, the wire-bonding machine is deployed to form stud bumps 252 on the bonding pads 214 of the first chip 210 by stamping. Next, the wire-bonding machine is again deployed to form stud bumps 254 on top of the respective stud bumps 252. Thereafter, an underfill film 261 made from an insulating material is formed over the active surface 216 of the first chip 210. The underfill film 261 exposes the top surface of the contacts 250 to produce a package module 219 that can be electrically tested independently. Furthermore, the underfill film 261 has an opening 263 in the middle, capable of accommodating the package module 229.

In this embodiment, the package module 219 comprises the package module 229, the first chip 210, the contacts 250 and the underfill film 261. After testing the electricity of the package module 219, the package module 219 is mounted on the substrate 230. A screen printing method can be one of the ways to deposit solder material 282 on the bonding pads 232 of the substrate 230. The package module 219 is connected to the substrate 230 such that the contacts 250 are in contact with the solder material 282 over the bonding pads 232. A reflow process is carried out to join the contacts 250 to the respective bonding pads 232 on the substrate 230 via the solder material 282. Hence, the first chip 210 is electrically connected to the substrate 230 through the contacts 250 and the solder material 282. However, the method of joining the contacts 250 with the bonding pads 232 is not limited to the aforementioned process. For example, a thermal-sonic bonding may be used to bond the contacts 250 directly to the respective bonding pads 232 on the substrate 230 after checking the electrical performance of the package module 219. Thereafter, the underfill film 261 is thermally cured to fill the space between the first chip 210 and the substrate 230.

As shown in FIGS. 2 and 3, the second chip 220 is sandwiched between the first chip 210 and the substrate 230. Furthermore, the second chip 220 is located within the active surface 216 of the first chip 210. Both underfill films 260 and 261 are located on the active surface 216 of the first chip 210 to enclose the bumps 240 and the contacts 250. The solder balls 270 are attached to the bonding pads 234 on the under surface 238 of the substrate 230.

In FIG. 2, the height of the second chip 220 in a direction perpendicular to the active surface 216 of the first chip 210 is defined as h1. The height of the bump 240 in a direction perpendicular to the active surface 216 of the first chip 210 is defined as h2. The height of the contact 250 in a direction perpendicular to the active surface 216 of the first chip 210 is defined as h3. The values of h1, h2 and h3 are related by the inequality: h3>h2+h1. In addition, if the distance between the substrate 230 and the active surface 216 of the first chip 210 is defined as d, the values of d, h1 and h2 are related by the inequality: d>h1+h2.

In this embodiment, the second chip 220 is positioned between the first chip 210 and the substrate 230. Since there is no need to form an opening in the substrate 230 as in a conventional multi-chip package design, a complete internal circuit wiring space is maintained. This design not only reduces the average length of transmission pathways to improve electrical performance, but also simplifies the process of manufacturing the substrate 230. Moreover, the perimeter of the substrate 230 can be reduced leading to a smaller area occupation for the multi-chip package 200. Furthermore, the electrical testing of the package module 229 before joining to the first chip 210 and the electrical testing of the package module 219 before joining to the substrate 230 are performed to ensure the performance and yield of the multi-chip package.

Figure 4:
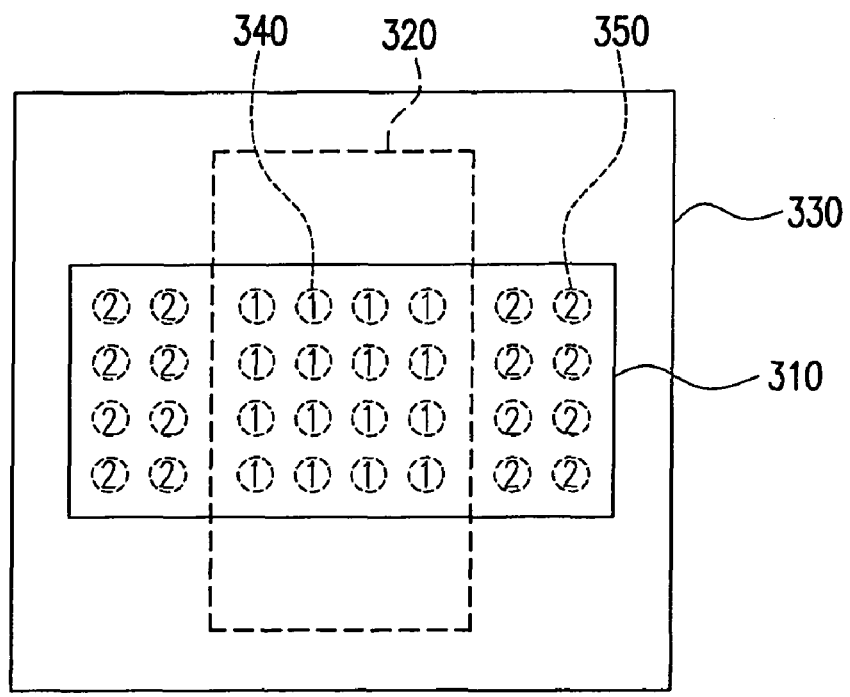
FIG. 4 is a top view showing a multi-chip package according to a second preferred embodiment of this invention.

FIG. 4 is a top view showing a multi-chip package according to a second preferred embodiment of this invention. The multi-chip package structure according to the second embodiment is an extension to the first embodiment. Similarly, the second chip 320 is located between the first chip 310 and the substrate 330. The first chip 310 is electrically connected to the second chip 320 via bumps 340 (labeled 1 in FIG. 4). The first chip 310 is electrically connected to the substrate 330 via contacts 350 (labeled 2 in FIG. 4). The height of the contacts 350 is greater than the combination of the thickness of second chip 320 and the height of the bump 340. Hence, unlike the conventional design, the substrate 330 has no opening or cavity to reduce wiring space inside the multi-chip package. One major difference of the second embodiment from the first embodiment is that both the first chip 310 and the second chip 320 are rectangular with the first chip 310 extending in a direction perpendicular to the second chip 320. Moreover, the second chip 320 extends over areas outside the active surface of the first chip 310.

Figure 5:
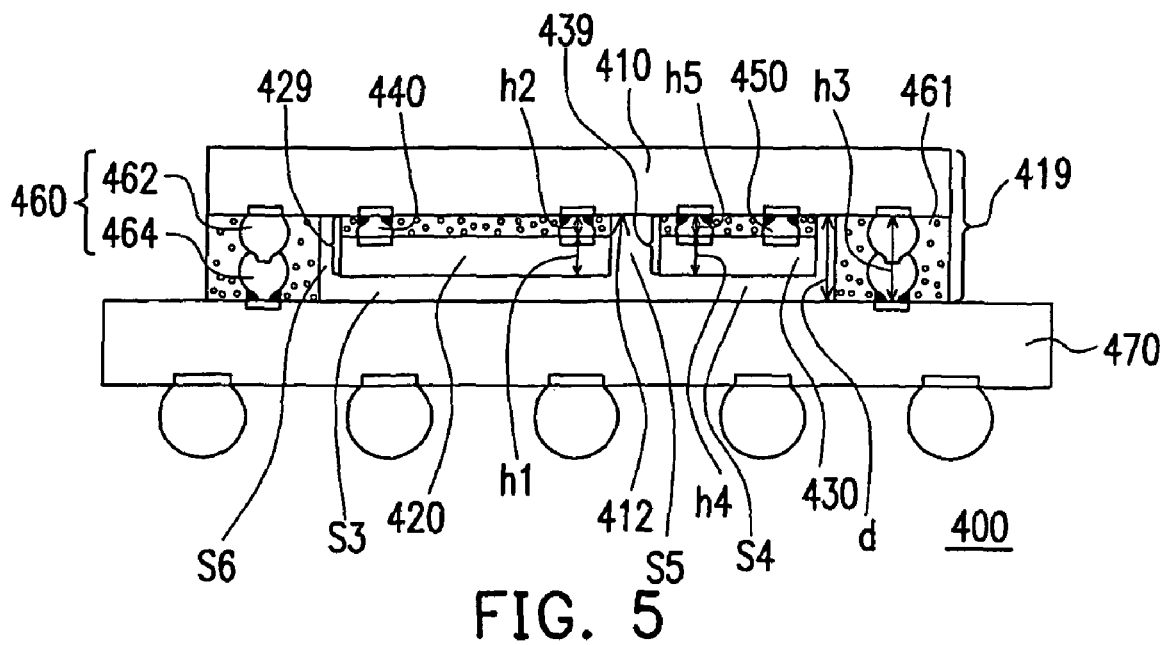
FIG. 5 is a cross-sectional view of a multi-chip package according to a third preferred embodiment of this invention.
Figure 6:
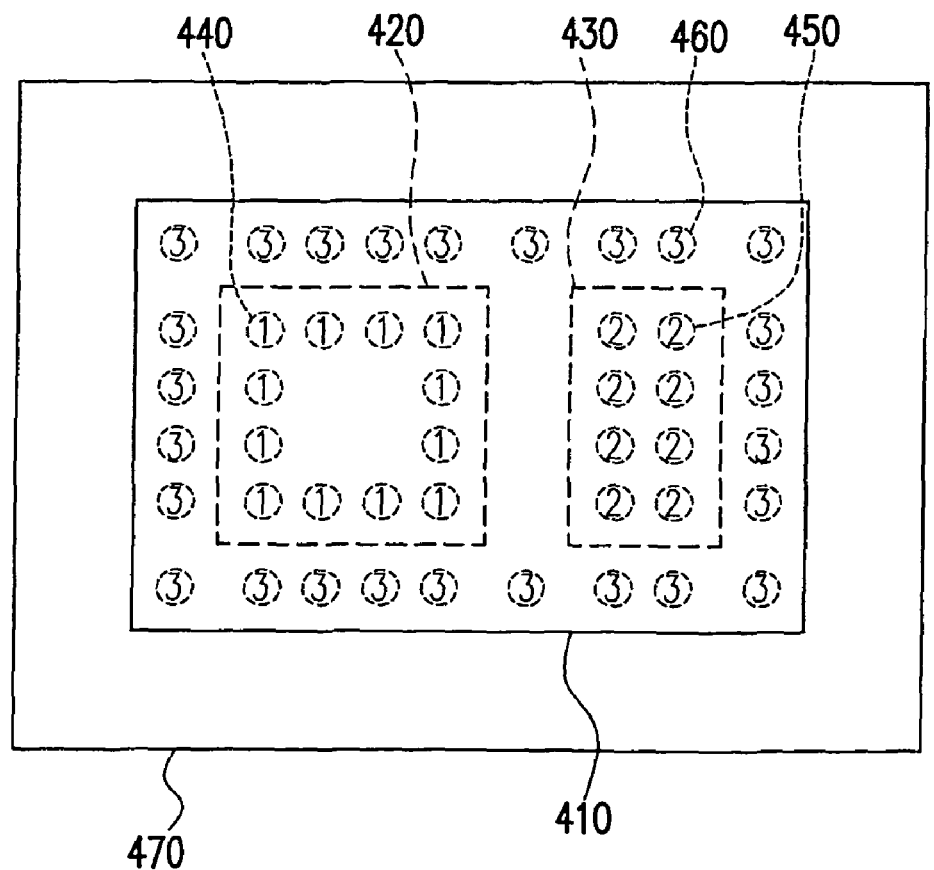
FIG. 6 is a top view showing the multi-chip package according to the third preferred embodiment of this invention.

FIG. 5 is a cross-sectional view of a multi-chip package according to a third preferred embodiment of this invention. FIG. 6 is a top view showing the multi-chip package according to the third preferred embodiment of this invention. The third embodiment is an extension of the first embodiment of this invention. As shown in FIGS. 5 and 6, a second chip 420 and a third chip 430 are set up over an active surface 412 of a first chip 410. The second chip 420 is electrically connected to the first chip 410 via bumps 440 (labeled 1 in FIG. 6). The third chip 430 is electrically connected to the first chip 410 via bumps 450 (labeled 2 in FIG. 6). The first chip 410 is electrically connected to a substrate 470 via contacts 460 (labeled 3 in FIG. 6). Each contact 460 comprises a pair of stacked bumps 462 and 464. The stacked bumps 462 and 464 are formed, for example, by stamping via a wire-bonding machine.

After fabricating bumps 440 and bumps 450 over the second chip 420 and the third chip 430, package modules 429 and 439 having a chip-scale structure are formed. Before attaching the package modules 429 and 439 to the first chip 410, each of the package modules 429 and 439 is electrically tested to ensure good electrical performance. After mounting the package modules 429 and 439 and forming the contacts 460 on the first chip 410 to form a package module 419, the package module 419 is also electrically tested to ensure good electrical connection and performance. Thereafter, the package module 419 is attached to the substrate 470. Through the aforementioned electrical testing of the package modules 419, 429 and 439, ultimate yield of the multi-chip package 400 effectively increases.

In FIG. 5 the height of the second chip 420 in a direction perpendicular to the active surface 412 of the first chip 410 is defined as h1. The height of the bump 440 in a direction perpendicular to the active surface 412 of the first chip 410 is defined as h2. The height of the contact 460 in a direction perpendicular to the active surface 412 of the first chip 410 is defined as h3. The height of the third chip 430 in a direction perpendicular to the active surface 412 of the first chip 410 is defined as h4. The height of the bump 450 in a direction perpendicular to the active surface 412 of the first chip 410 is defined as h5. The values of h1, h2, h3, h4 and h5 are related by the following inequalities: h3>h1+h2, h3>h4+h5. In addition, if the distance between the substrate 470 and the active surface 412 of the first chip 410 is defined as d, the values of d, h1, h2, h4 and h5 are related by the following inequalities: d>h1+h2, d>h4+h5. In this embodiment, the second chip 420 and the third chip 430 are sandwiched between the first chip 410 and the substrate 470. Hence, unlike a conventional design, the substrate 470 also has no opening to reduce wiring space inside the multi-chip package.

In the third embodiment, a pair of package modules 429 and 430 are enclosed within the space between the first chip 410 and the substrate 470. In general, any number of package modules can be enclosed as long as there is sufficient space between the first chip 410 and the substrate 470.

Figure 7:
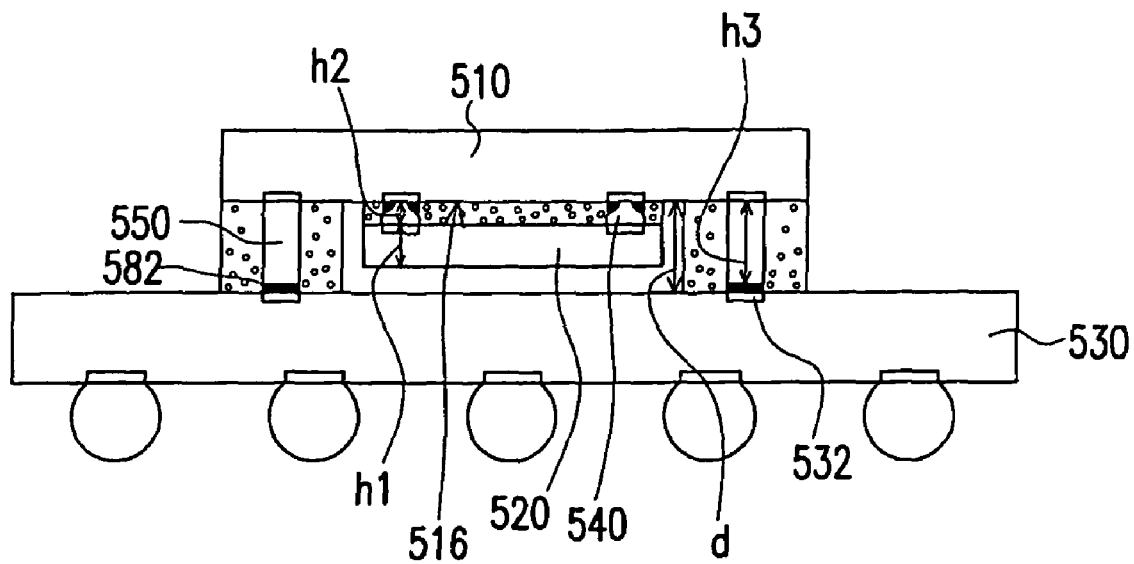
FIG. 7 is a cross-sectional view of a multi-chip package according to a fourth preferred embodiment of this invention.

In the aforementioned embodiments, the contacts are fabricated from a pair of stacked bumps. However, the number of stacked bumps for forming the contact is unrestricted. FIG. 7 is a cross-sectional view of a multi-chip package according to a fourth preferred embodiment of this invention. Since the multi-chip package structure in this embodiment is similar to the one in the first embodiment, detailed description of the identical portions are omitted. One aspect of this embodiment is that the contacts 550 are cylindrical metallic rods fabricated through a multi-layered printing method, for example.

The height of the second chip 520 in a direction perpendicular to the active surface 516 of the first chip 510 is defined as h1. The height of the bump 540 in a direction perpendicular to the active surface 516 of the first chip 510 is defined as h2. The height of the contact 550 in a direction perpendicular to the active surface 516 of the first chip 510 is defined as h3. The values of h1, h2 and h3 are related by the following inequality: h3>h1+h2. In addition, if the distance between the substrate 530 and the active surface 516 of the first chip 510 is d, then the values of d, h1 and h2 are related by the inequality: d>h1+h2.

Figure 8:
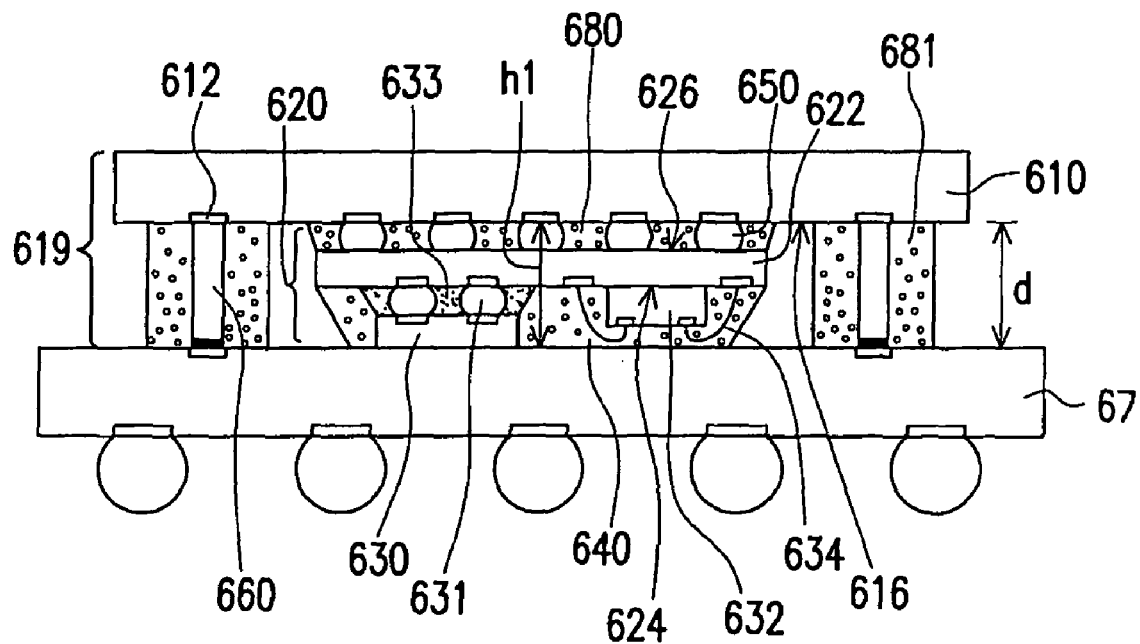
FIG. 8 is a cross-sectional view of a multi-chip package according to a fifth preferred embodiment of this invention.

In all the aforementioned embodiments, the package modules 229, 429, 439 on the chips 210 and 410 are chip-scale packages. However, the application of this invention is not restricted as such. FIG. 8 is a cross-sectional view of a multi-chip package according to a fifth preferred embodiment of this invention. The package module 620 mounted on the chip 610 in FIG. 8 can have a multi-chip module (MCM) or a system in package (SIP) structure. As shown in FIG. 8, the package module 620 comprises a module substrate 622, a pair of chips 630, 632, some packaging material 640 and a plurality of bumps 650. The module substrate 622 has a first surface 624 and a second surface 626. The chips 630, 632 are bonded to the first surface 624. The bumps 650 are attached to the second surface 626. The chip 630 is attached to the module substrate 622 as a flip chip via a plurality of module bumps 631. Gap-filling material 633 is inserted into the space between the chip 630 and the module substrate 622 to enclose the module bumps 631. The chip 632 is electrically connected to the module substrate 622 via a plurality of wire-bonded conductive wires 634. The packaging material encloses the chips 630, 632 and the conductive wires 634. The entire package module 620 is bonded to the chip 610 via bumps 650.

Before joining the package module 620 to the chip 610, the package module 620 is electrically tested to ensure its electrical performance. After mounting the package module 620 onto the chip 610 to form a package module 619, the package module 619 is again tested to ensure its electrical performance. The entire package 619 is mounted on the substrate 670. Furthermore, an underfill film 680 is formed in the space between the chip 610 and the module substrate 622 so that the bumps 650 are enclosed. Similarly, another underfill film 681 is formed in the space between the chip 610 and the substrate 670 to enclose the contacts 660.

In the fifth embodiment, the package module 620 is in contact with the substrate 670 so that any heat generated by the module 620 can be conducted away via the substrate 670. In other words, the heat-dissipating capacity of the package module 620 effectively increases. However, the package module 620 needs not to contact the substrate 670. In addition, the package module 620 may include more than two chips.

In addition, cylindrical metallic rods or posts serve as contacts 660 inside the multi-chip package. However, the contacts 660 can be stacked bumps attached to the bonding pads 612 of the chip 610 with a wire-bonding machine similar to the one deployed according to the first embodiment of this invention.

If the height of the package module 620 in a direction perpendicular to the active surface 616 of the chip 610 is h1 and the distance from the substrate 670 to the active surface 616 of the chip 610 is d, then the values of d and h1 are related by the inequality: $d > h1$.

In summary, several advantages of this invention include:

1. The substrate inside the multi-chip package is free of any through opening or cavity so that the average length of signal transmission pathways is reduced and the electrical performance of the substrate is improved.

2. Because forming a through opening or cavity in the substrate for accommodating a chip renders unnecessary, the process of manufacturing the substrate is simplified and the cost of producing the multi-chip package is reduced.

3. In the absence of a through opening or cavity in the substrate for accommodating a chip, the entire substrate can be used for accommodating circuit wires so that overall level of integration effectively increases. Thus, the perimeter of the substrate can be reduced and a multi-chip package occupying a smaller area can be produced.

4. Because the package modules are independently tested before assembling, overall yield of the multi-chip package effectively increases.

Figure 9:
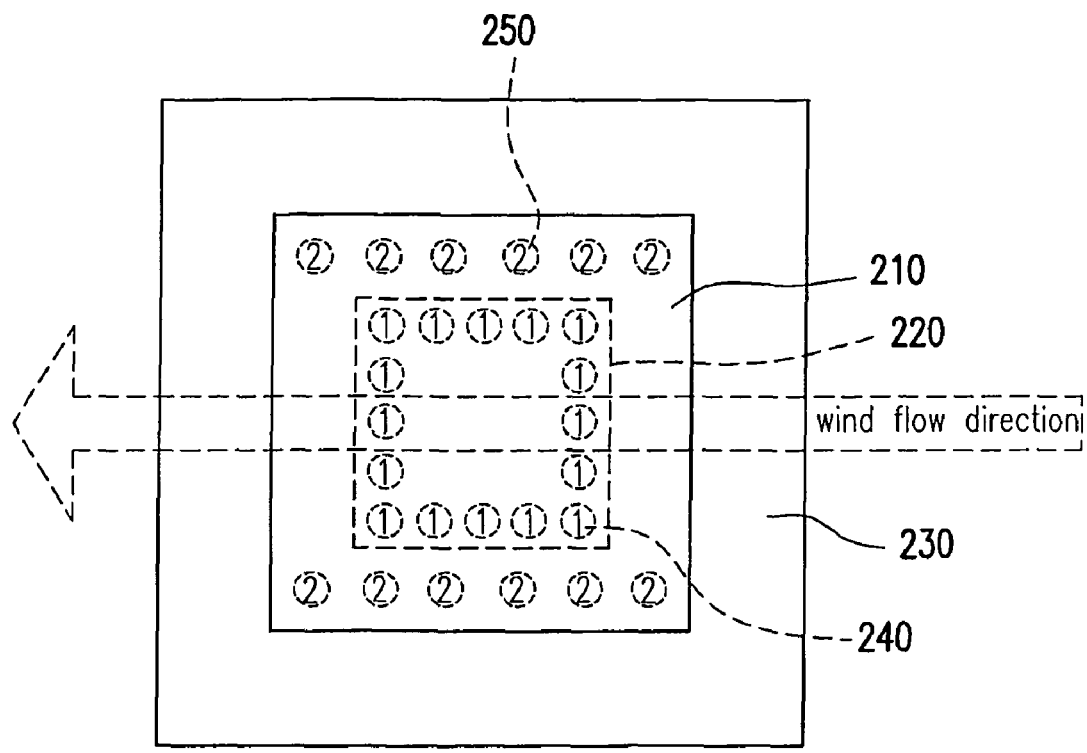
FIGS. 9-10 are top views of embodiments related to FIG. 2 in accord with the present invention.
Figure 10:
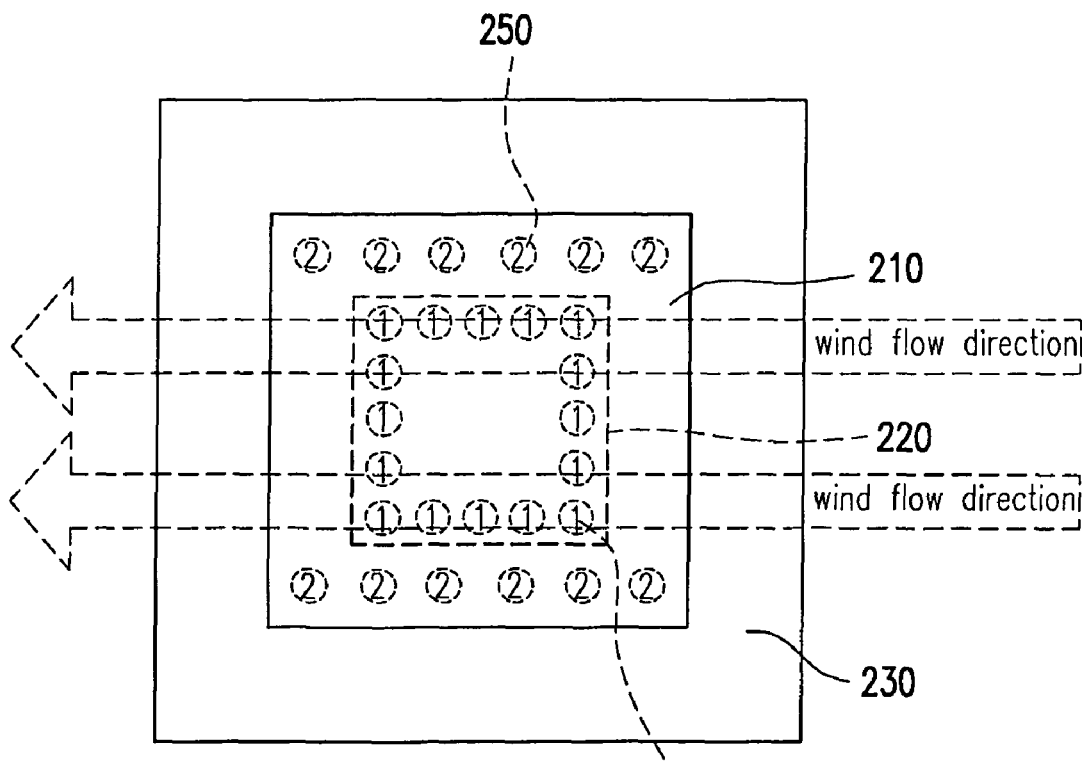

The present invention gives another embodiment. Refer to FIG. 2 again. The second chip 220 is at a distance away from the substrate 230, and it indicates that the second chip 220 and the substrate 230 defines a empty space S1 not filled with underfill materials. The purpose of keeping the empty space S1 empty from underfill materials is that the heat emitting from the second chip 220 can be taken away by the wind flowing under the second chip 220. To make sure that the heat can be taken away, the arrangement of the contacts 250 should be adjusted. Specifically, the layouts of the contacts 250 should allow the wind to flow into the empty space S1 between the second chip 220 and the substrate 230. For example, in FIG. 9, the two opposite sides where the contacts 250 are previously located in FIG. 2 have no contacts so that the wind can flow underneath the second chip 220. Additionally, in FIG. 10, there still may be some contacts 250 located at either of the two opposite sides. If there are still some contacts 250 at either of the two opposite sides, the wind would be separated into at least two streams and still flow into the empty space S1 between the second chip 220 and the substrate 230.

Refer to FIG. 2 again. The present invention also provides another embodiment related the space feature. In FIG. 2, the underfill film 261 and the second chip 220 may define a empty space S2. In the empty space S2, no underfill materials exist so that the second chip 220 is isolated from the columns made of the underfill film 261 and the contacts 250.

Refer to FIG. 5 again. This embodiment has the two chips 420, 430 that are connected to the first chip 410, and may have a feature where the second chip 420 and the substrate 470 defines a empty space S3. And the embodiment may also have another feature where the third chip 430 and the substrate 470 defines a empty space S4.

In the embodiment in FIG. 5, the second chip 420 and the third chip 430 may define a empty space S5. Additionally, the second chip 420 (or the third chip 430) and the underfill film 461 may define a empty space S6 that encompasses the contacts 460.

The purpose of the empty spaces S3, S4, S5, and S6 is to improve heat transfer of the chips 420 and 430 because the empty spaces S3, S4, S5 and S6 allows wind to flow underneath the chips 420 and 430 so that the heat generated by the chips 420 and 430 can be taken away. To secure the heat transfer purpose, the layouts of the contacts 460 should be modified. Please see FIGS. 11-14, and there are some exemplary layouts of the contacts 460.

Figure 11:
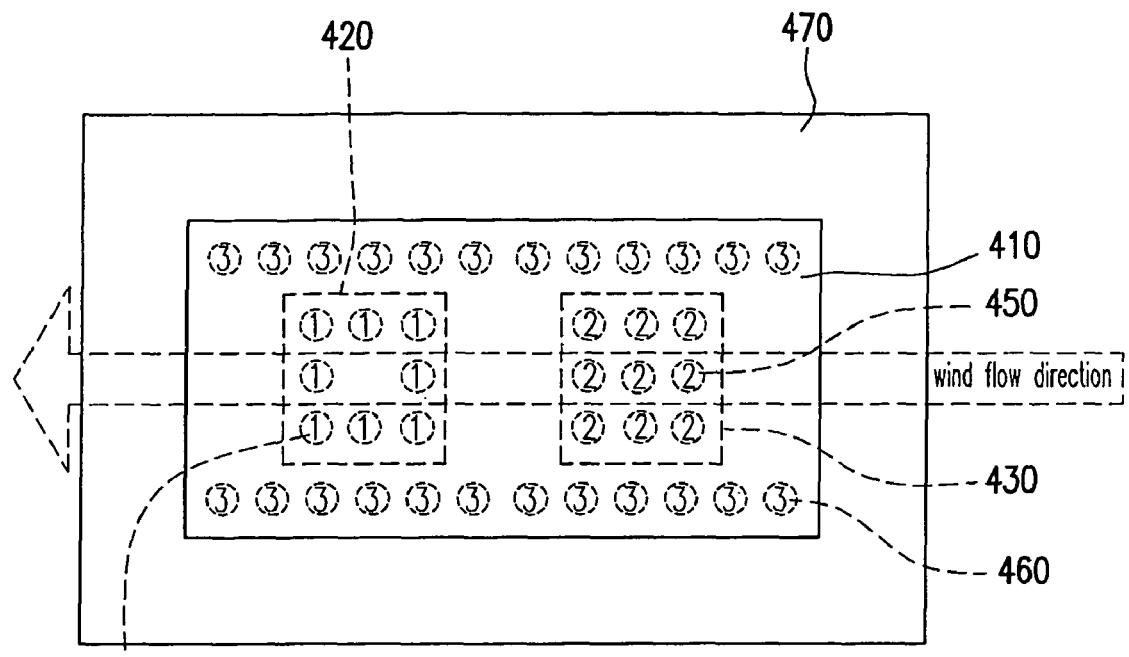
FIGS. 11-14 are top views of embodiments related to FIG. 5 in accord with the present invention.

In FIG. 11, either of the two opposite sides is open to allow wind to flow into the empty spaces between the chips 420 and 430 and the substrate 470. There are no contacts 460 placed at either of the sides where the wind has to flow in and out. However, in some embodiments, for example FIG. 14, some contacts 460 may be disposed at either of the two opposites. The effect is that the wind would be separated into several streams to flow into the space underneath the chips 420 and 430.

Figure 12:
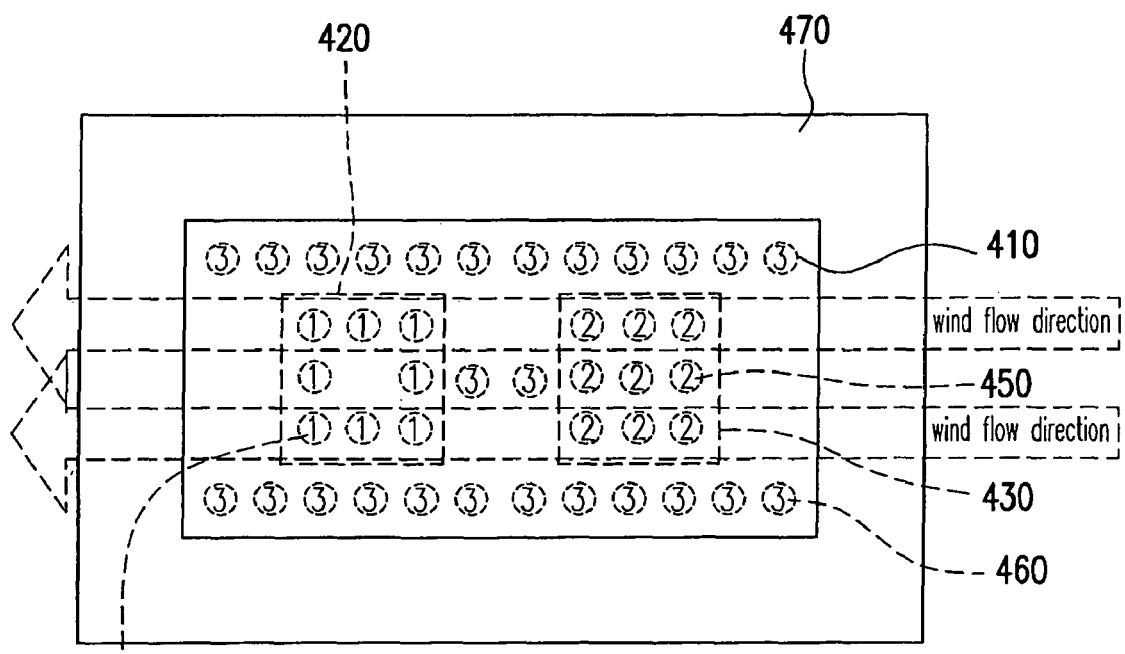
Figure 13:
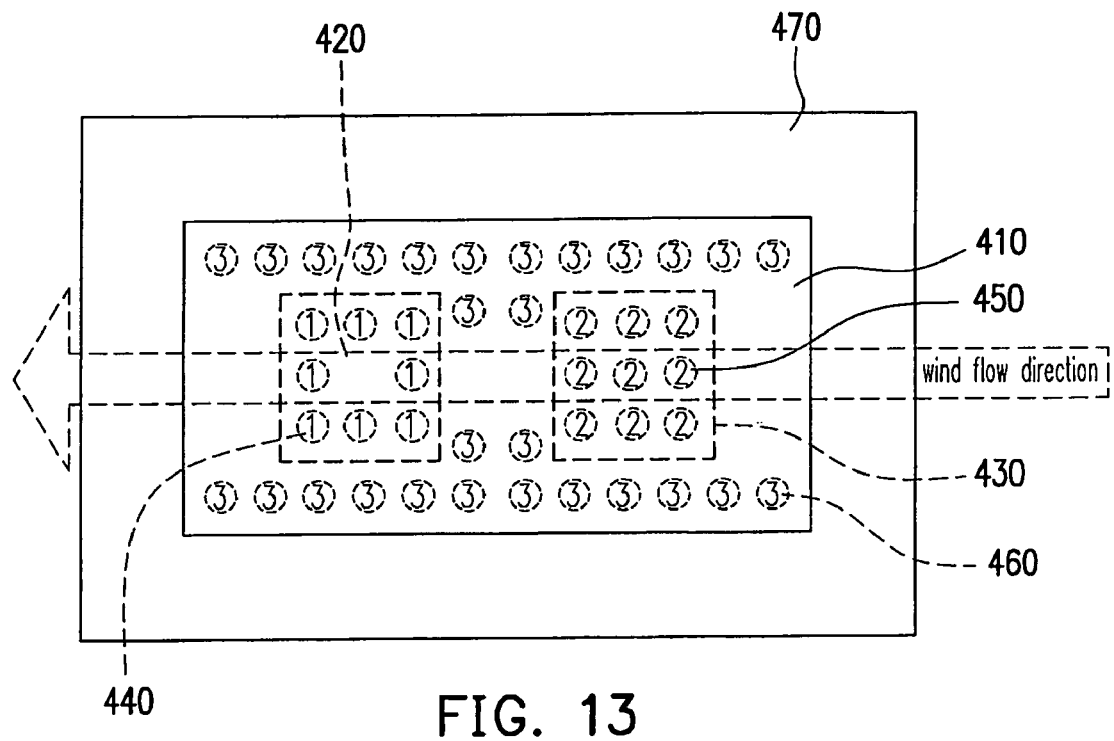
Figure 14:
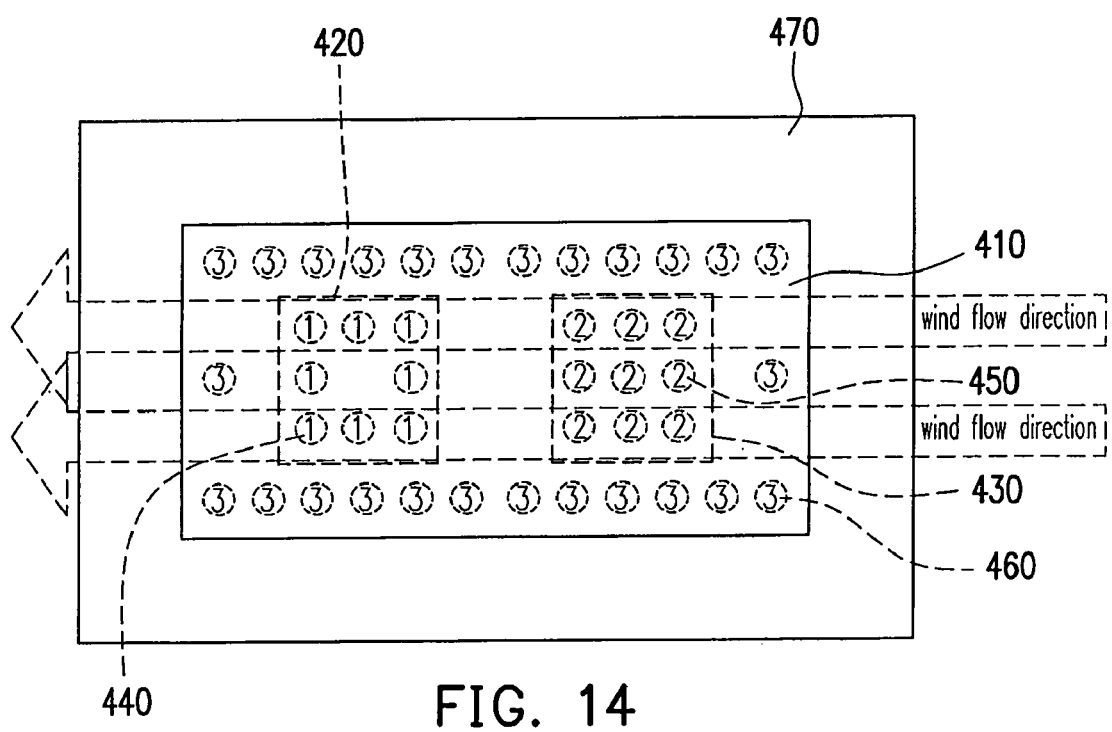

In FIG. 12, the difference between the embodiment in FIG. 12 and the embodiment in FIG. 11 is that some contacts 460 are disposed in the empty space between the second chip 420 and the third chip 430. The arrangement of the contacts 460 between the chips 420 and 430 has to allow the wind to flow from the second chip 420 to the third chip 430 or from the third chip 430 to the second chip 420. Besides, in FIG. 13, there is another layout of the contacts 460. The difference between the embodiment in FIG. 12 and the embodiment in FIG. 13 is that, in the empty space between the chips 420 and 430, and the layout in FIG. 12 may separate the wind while the layout in FIG. 13 still provides one tunnel for the wind as passing through the empty space between the chips 420 and 430 and the substrate 470.

The main advantage of the embodiments related to FIGS. 11-14 is that the second chip 420 and the third chip 430 can be a chip with high power consumption, for example CPU, graphic chip, and so on. With the empty spaces placed underneath the first chip 410, wind can flow underneath the second chip 420 or the third chip 430 to take away the heat generated by the second chip 420 and the third chip 430.

It should be noted that the arrangements of the contacts 250 or 460 are flexible and adjustable. This means that any layouts of the contacts are acceptable as long as the layout allows wind to flow into the empty space underneath the chips 220, 420, and 430 and to take away the heat generated by them.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-chip package module, comprising:
 a substrate;
 a first chip positioned over the substrate and having an active surface;

a second chip connected to the active surface of the first chip and positioned between the substrate and the first chip, wherein a height of the second chip in a direction perpendicular to the active surface is defined as h1, and a first empty space is defined by the second chip and the substrate so that the second chip does not contact the substrate;

a plurality of first bumps positioned between the active surface of the first chip and the second chip, wherein a height of the first bumps in the direction perpendicular to the active surface is defined as h2;

a plurality of contacts protruding from the active surface of the first chip, wherein each of the contact comprises a plurality of stacked second bumps, the contacts do not overlap the second chip in their orthographic projections on the substrate, a height of the contacts in the direction perpendicular to the active surface is defined as h3, values of h1, h2, and h3 are related by an inequality of h3>h1+h2, and a thickness of the first empty space in the direction perpendicular to the active surface is equal to h3−(h1+h2); and an underfill film made from an insulating material and formed over the active surface of the first chip, wherein the underfill film covers the stacked second bumps of the contacts and exposes the top surface of the contacts, and a second empty space is defined by the second chip and the underfill film to isolate the second chip from the underfill film.

2. The multi-chip package module of claim 1, further comprising an insulating material over the active surface of the first chip that encloses the first bumps and the contacts.

3. The multi-chip package module of claim 1, further comprising a third chip and a plurality of third bumps, wherein the third chip is connected to the active surface of the first chip as a flip chip structure, the third bumps are positioned between the active surface of the first chip and the third chip, a height of the third chip in the direction perpendicular to the active surface being defined as h4, a height of the third bumps in the direction perpendicular to the active surface being defined as h5, and values of h3, h4 and h5 are related by an inequality of h3>h4+h5.

4. The multi-chip package module of claim 3, further comprising a third empty space between the second chip and the third chip to isolate the second chip from the third chip.

5. The multi-chip package module of claim 3, wherein a fourth empty space is defined by the third chip and the underfill film to isolate the third chip from the underfill film.

6. A multi-chip package structure, comprising:
a substrate;
a plurality of contacts, wherein each of the contact comprises a plurality of stacked second bumps;
a first chip having an active surface that faces the substrate, wherein the contacts are positioned between the first chip and the substrate, and a distance between the substrate and the active surface in a direction perpendicular to the active surface is defined as d;
a second chip positioned between the first chip and the substrate, wherein a height of the second chip in the direction perpendicular to the active surface is defined as h1, the contacts do not overlap the second chip in their orthographic projections on the substrate, and a first empty space is defined by the second chip and the substrate so that the second chip does not contact the substrate;
a plurality of first bumps positioned between the active surface of the first chip and the second chip for electric connection, wherein a height of the first bumps in the direction perpendicular to the active surface is defined as h2, values of h1, h2 and d are related by an inequality of d>h1+h2, a height of the contacts in the direction perpendicular to the active surface is defined as h3, and a thickness of the first empty space in the direction perpendicular to the active surface is equal to h3−(h1+h2); and an underfill film made from an insulating material and formed over the active surface of the first chip, wherein the underfill film covers the stacked second bumps of the contacts and exposes the top surface of the contacts, and a second empty space is defined by the second chip and the underfill film to isolate the second chip from the underfill film.

7. The multi-chip package structure of claim 6, further comprising an insulating material over the active surface of the first chip that encloses the first bumps and the contacts.

8. The multi-chip package structure of claim 6, wherein a values of h1, h2 and h3 are related by an inequality of h3>h1+h2.

9. The multi-chip package structure of claim 6, further comprising a third chip and a plurality of third bumps such that the third chip is positioned between the first chip and the substrate, as well as the third bumps are positioned between the first chip and the third chip to connect together as a flip chip structure, wherein a height of the third chip in the direction perpendicular to the active surface is defined as h4 and a height of the third bumps in the direction perpendicular to the active surface is defined as h5, and values of d, h4 and h5 are related by an inequality of d>h4+h5.

10. The multi-chip package module of claim 9, further comprising a third empty space between the second chip and the third chip to isolate the second chip from the third chip.

11. The multi-chip package module of claim 9, wherein a third empty space is defined by the third chip and the underfill film to isolate the third chip from the underfill film.

12. The multi-chip package structure of claim 9, wherein a height of the contacts in the direction perpendicular to the active surface is defined as h3 and values of h3, h4 and h5 are related by an inequality of h3>h4+h5.

13. A multi-chip package module, comprising:
a first chip having an active surface;
a substrate adjacent to the first chip;
a plurality of contacts connecting the first chip and the substrate;
a second chip disposed between the first chip and the substrate and connecting to the first chip, wherein the contacts do not overlap the second chip in their orthographic projections on the substrate; and
an underfill film, wherein the underfill film covers the contact to isolate the contact from the second chip, wherein a first empty space is defined by the second chip and the substrate so that the second chip does not contact the substrate, a height of the second chip in a direction perpendicular to the active surface is defined as h1, a height of the first bumps in the direction perpendicular to the active surface is defined as h2, a height of the contacts in the direction perpendicular to the active surface is defined as h3, and a thickness of the first empty space in the direction perpendicular to the active surface is equal to h3−(h1+h2).

14. The multi-chip package module of claim 13, wherein a second empty space is defined by the second chip and the underfill film to isolate the second chip from the underfill film.

15. The multi-chip package module of claim 13, further comprising a third chip disposed between the first chip and the substrate and connecting to the first chip, wherein a third empty space is defined by the third chip and one of the second chip, the underfill film, and the substrate to isolate the third chip from the one of the second chip, the underfill film, and the substrate.

16. The multi-chip package module of claim 13, further comprising a plurality of first bumps connecting the first chip and the second chip.

17. The multi-chip package module of claim 16, further comprising an insulating material enclosing the first bumps.

18. The multi-chip package module of claim 13, wherein the contact comprises at least two second bumps stacked one-by-one.

* * * * *